United States Patent
Osaki et al.

(10) Patent No.: US 11,129,320 B2
(45) Date of Patent: Sep. 21, 2021

(54) FEEDER TRACE LOG SAVING SYSTEM

(71) Applicant: FUJI CORPORATION, Chiryu (JP)

(72) Inventors: Satoshi Osaki, Nagoya (JP); Yoshiyuki Fukaya, Chiryu (JP); Hideaki Oki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 311 days.

(21) Appl. No.: 15/770,877

(22) PCT Filed: Oct. 28, 2015

(86) PCT No.: PCT/JP2015/080444
§ 371 (c)(1),
(2) Date: Apr. 25, 2018

(87) PCT Pub. No.: WO2017/072889
PCT Pub. Date: May 4, 2017

(65) Prior Publication Data
US 2018/0317354 A1 Nov. 1, 2018

(51) Int. Cl.
*H05K 13/08* (2006.01)
*H05K 13/02* (2006.01)
(Continued)

(52) U.S. Cl.
CPC ....... *H05K 13/084* (2018.08); *G05B 19/4184* (2013.01); *G06F 16/2282* (2019.01);
(Continued)

(58) Field of Classification Search
None
See application file for complete search history.

(56) References Cited

U.S. PATENT DOCUMENTS 6,983,532 B2 * 1/2006 White ............... H05K 13/0857
29/740
8,879,295 B1 * 11/2014 Barth, Jr. ............... G11C 29/76
365/200
(Continued)

FOREIGN PATENT DOCUMENTS

CN 101053293 A 10/2007
EP 2 528 425 A2 11/2012
(Continued)

OTHER PUBLICATIONS

Terawaki Yoshihide, JP 2005-150388 A, machine translation.*
(Continued)

*Primary Examiner* — Eman A Alkafawiz
*Assistant Examiner* — Denise R Karaviasz
(74) *Attorney, Agent, or Firm* — Oblon, McClelland, Maier & Neustadt, L.L.P.

(57) ABSTRACT

A trace memory that stores trace logs of multiple feeders set on a feeder setting table of a component mounter is provided in the feeder setting table, and while the component mounter is operating, trace logs of each feeder are output from the control sections of the multiple feeders on the feeder setting table to the feeder setting table, and are stored by a communication control section of the feeder setting table in the trace memory linked to identification information of each feeder. By this, it is possible to save trace logs from multiple feeders on the feeder setting table all together in a shared trace memory, such that it is not necessary to load trace memory on each feeder, thereby meeting requirements of compact feeders and lower costs.

20 Claims, 3 Drawing Sheets

(51) Int. Cl.
*G06F 16/22* (2019.01)
*H05K 13/04* (2006.01)
*G05B 19/418* (2006.01)

(52) U.S. Cl.
CPC ......... *H05K 13/02* (2013.01); *H05K 13/0419* (2018.08); *G05B 2219/35291* (2013.01)

(56) References Cited

U.S. PATENT DOCUMENTS

| | | | | |
|---|---|---|---|---|
| 2008/0103616 | A1* | 5/2008 | Wada | H05K 13/0419 700/95 |
| 2013/0008019 | A1* | 1/2013 | Abe | H05K 13/0813 29/720 |
| 2014/0290055 | A1* | 10/2014 | Kurata | H05K 13/085 29/832 |

FOREIGN PATENT DOCUMENTS

| | | | | |
|---|---|---|---|---|
| EP | 2528425 | A2 * | 11/2012 | ............. H05K 13/04 |
| EP | 2528425 | A2 * | 11/2012 | ......... H05K 13/0417 |
| JP | 2004-47571 | A | | 2/2004 |
| JP | 2005-150388 | A | | 6/2005 |
| JP | 2005150388 | A * | 6/2005 | ............. H05K 13/02 |
| JP | 2011-159699 | A | | 8/2011 |
| JP | 2012-29254 | A | | 2/2012 |

OTHER PUBLICATIONS

Asakura, JP 2011-159699 A, machine translation.*
English translation of JP 2005150388A, Apr. 2020.*
Machine translation Espacenet.com, Asakura, Ryoji, Component Mounting Apparatus with Abnormality Detecting Device, EP2355646A2, Aug. 10, 2011 (Year: 2020).*
Machine translation, Dialog, Terawaki, Yoshhide, Surface Mounting Machine, JP2005150388A, Jun. 9, 2005 (Year: 2020).*
Extended European Search Report dated Sep. 18, 2018 in European Patent Application No. 15907253.7, 9 pages.
International Search Report dated Jan. 19, 2016 in PCT/JP2015/080444 filed Oct. 28, 2015.

* cited by examiner

FEEDER TRACE LOG SAVING SYSTEM

TECHNICAL FIELD

The present application relates to a feeder trace log saving system for saving trace logs of multiple feeders that supply components to a component mounter.

BACKGROUND ART

When some kind of problem occurs during operation of a component mounter, in order to aid investigations into the cause of the problem, trace logs from before and after the problem occurred are saved in trace memory, such that the trace logs can be read from the trace memory after a problem occurs. For example, in patent literature 1 (JP-A-2012-29254), a configuration is disclosed in which an imaging device that images a component held by a suction nozzle of a component mounter is provided with flash memory that acts as trace memory for saving trace logs of the imaging device.

With respect to this, one may consider also providing trace memory for saving feeder trace logs in the feeders that are set on a feeder setting table of the component mounter, such that when some kind of problem occurs with a feeder, the trace logs of the feeder can be read from the trace memory inside the feeder to aid investigation into the cause of the problem.

CITATION LIST

Patent Literature

Patent literature 1: JP-A-2012-29254

BRIEF SUMMARY

Technical Problem

To reliably investigate causes of problems with feeders, it is necessary to save large amounts of trace logs in the trace memory, thus, trace memory with a large storage capacity is required.

However, because feeders are designed to be thin such that many feeders can be set lined up next to each other on the feeder setting table of the component mounter, there are cases in which it is difficult from a space point of view to load trace memory with a large capacity inside a feeder. Further, trace memory with a large capacity is relatively expensive, and the quantity of feeders used is high, so loading trace memory with a large capacity on each of the feeders would greatly increase costs, which is not desirable from a cost perspective.

Thus, an object of the present disclosure is to provide a system for saving trace logs of multiple feeders without having to provide trace memory in each feeder and for a low cost.

Solution to Problem

To solve the above problems, the present disclosure is a feeder trace log saving system for saving trace logs of multiple feeders that supply components to a component mounter, the feeder trace log saving system including: trace memory configured to save the trace logs of the multiple feeders, wherein a control section of the multiple feeders outputs the trace log of each of the feeders while the component mounter is operating, and saves the trace logs in the trace memory linked to identification information of each of the feeders. With this configuration, because a feeder trace log is output from each of the multiple feeders while the component mounter is operating and saved in the trace memory linked to the identification information of each of the feeders, it is possible to save trace logs from multiple feeders all together in a shared trace memory, such that it is not necessary to load trace memory on each feeder, thereby meeting requirements of compact feeders and lower costs. Further, because it is not necessary for the control section of the component mounter to perform processing of saving multiple feeder trace logs while the component mounter is operating, decreases in processing speed caused by large CPU loads on the control section of the component mounter due to processing of saving trace logs of multiple feeders can be prevented, and it is possible to save trace logs of multiple feeders in the trace memory without worsening productivity (cycle time). In this case, because trace logs of multiple feeders are saved in the trace memory linked to the identification information of each of the feeders, when some kind of problem occurs with a feeder, the trace log saved linked to the identification information of the feeder for which the trouble occurred can be read from the trace memory, such that the cause of the problem with the feeder can be investigated easily.

In this case, the feeder for which a trace log is saved is not limited to a tape feeder, for example, it may include a bulk feeder, a stick feeder, a tray feeder, or a die supply device.

Because component mounters are generally provided with a feeder setting table on which multiple feeders can be removably set, the trace memory may be provided in this feeder setting table. In this case, because a communication control section that controls communication between the component mounter and the multiple feeders is provided in the feeder setting table, the trace logs of each of the feeders may be output from the multiple feeders to the feeder setting table, and saved by the communication control section of the feeder setting table in the trace memory linked to the identification information of each of the feeders. By doing this, it is possible to save the trace logs output from multiple feeders in the trace memory using the communication control section of the feeder setting table, which has the benefit of a simplified circuit configuration for saving the trace logs of multiple feeders in the trace memory.

Further, with the present disclosure, a component mounter control section may output a component mounter trace log to the feeder setting table, and the communication control section in the feeder setting table may save the component mounter trace log output from the component mounter in the trace memory. By doing this, it is possible to also save the component mounter trace in the trace memory in which the trace logs of multiple feeders are saved, such that when some kind of problem occurs with a feeder, the trace log of the component mounter and the trace log saved linked to the identification information of the feeder for which the problem occurred can be read from the trace memory, such that the cause of the problem with the feeder can be investigated while considering the operating conditions of the component mounter, making it possible to more accurately investigate the causes of feeder problems.

Further, with the present invention, the trace memory may be or include a removable storage medium (for example, USB memory, memory card, electromagnetic disk, magneto-optical disk, or the like). By doing this, as well as allowing the trace memory to be exchanged simply, when a problem occurs with a feeder, the trace memory can be removed and sent to a department that investigates causes of problems (such as a company that manufactures or sells the feeder), such that even in a case in which the component mounter is not connected via a network to a computer of the department that investigates causes of problems, the trace logs can be easily read from the trace memory at the department that investigates causes of problems in order to investigate the cause of the problem. Note that, in a case in which the component mounter is connected via a network to a computer of the department that investigates causes of problems, trace logs may be read from the trace memory according to trace log sending requests and sent to the component mounter, and the component mounter control section may send the received trace logs to the computer of the department that investigates causes of problems via the network.

DESCRIPTION OF EMBODIMENTS

Figure 2:
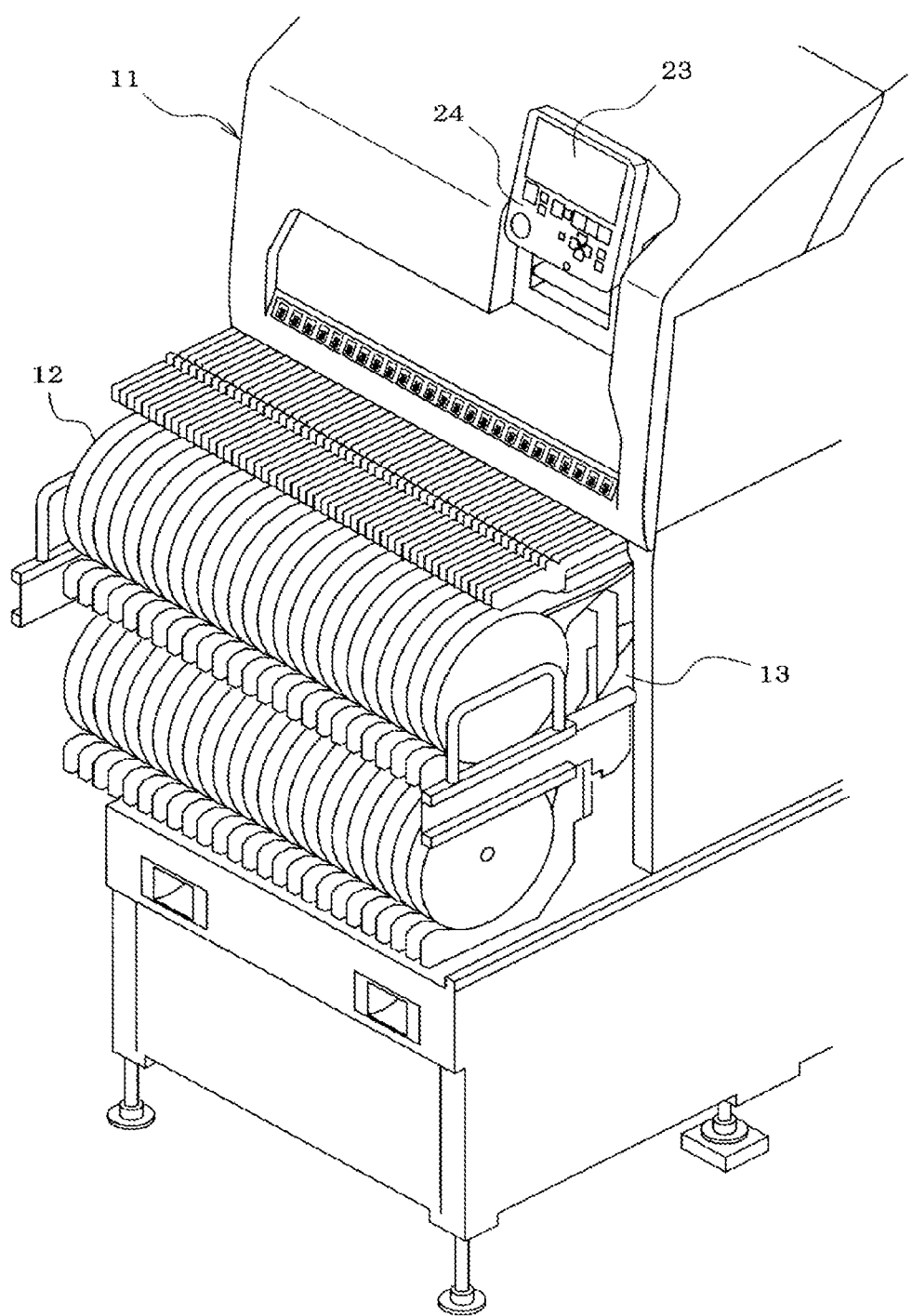
FIG. 2 is a perspective view from the front side of a component mounter.

An embodiment of the disclosure is described below. As shown in FIG. 2, feeder setting table 13, on which multiple feeders 12 can be removably set, is removably attached to the front side of component mounter 11. Here, feeder 12 is a tape feeder that supplies components via component supply tape in which components are packaged lined up in a row.

Figure 3:
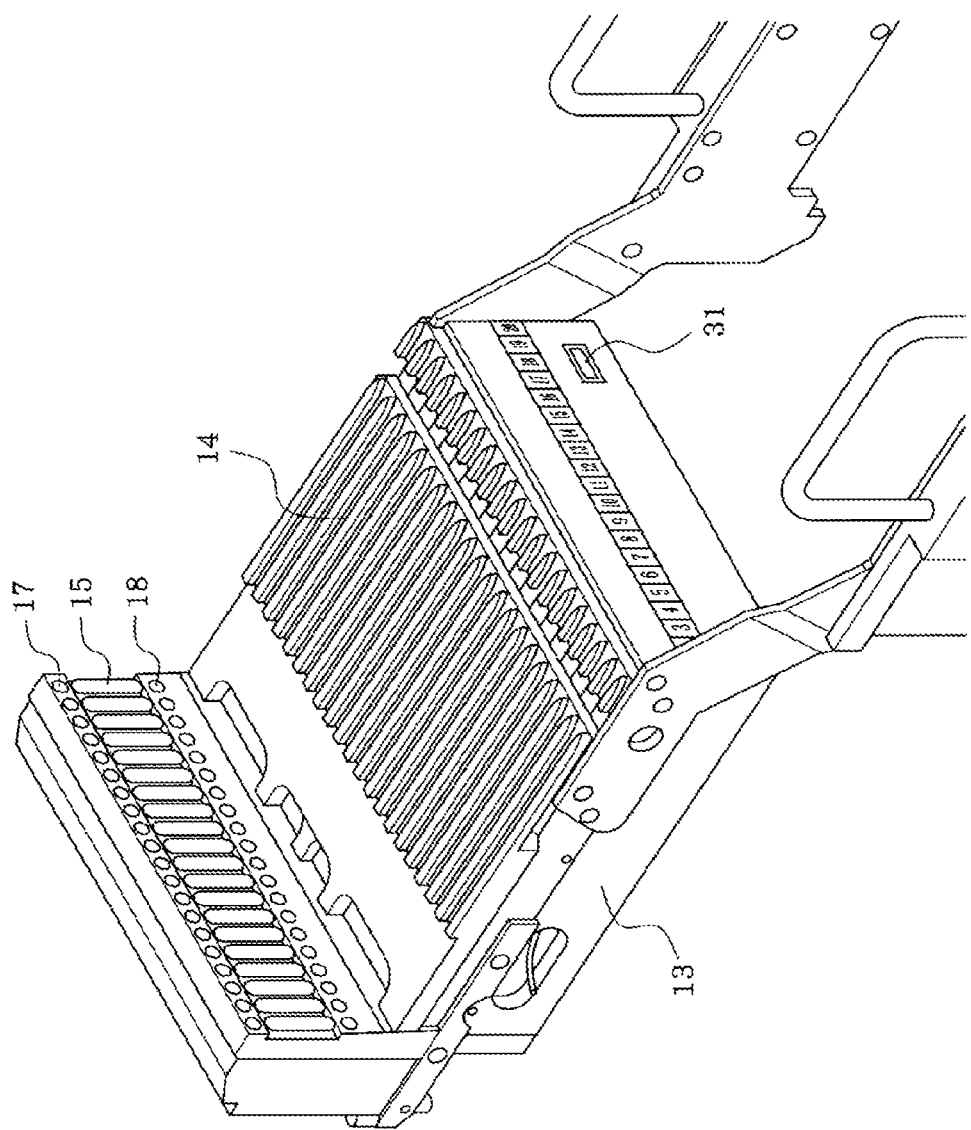
FIG. 3 is a perspective view of a feeder setting table of the component mounter.

As shown in FIG. 3, guide grooves 14 with an inverted T-shaped cross section for supporting feeders 12 vertically are provided in a top surface of feeder setting table 13, and by inserting a guide rail (not shown) with an inverted T-shaped cross section provided on a lower surface of feeder 12 into guide groove 14, feeder 12 is supported in a vertical state on feeder setting table 13.

Connector 16 for connecting a signal wire and a power supply wire of feeder 12 to connector 15 (refer to FIG. 3) of feeder setting table 13 and two positioning pins (not shown) are provided on a leading end surface of feeder 12, and by inserting the two positioning pins into position holes 17 and 18 (refer to FIG. 3) of feeder setting table 13, the attachment position of feeder 12 on feeder setting table 13 is determined and connector 16 of feeder 12 is inserted into and connected to connector 15 of feeder setting table 13.

Figure 1:
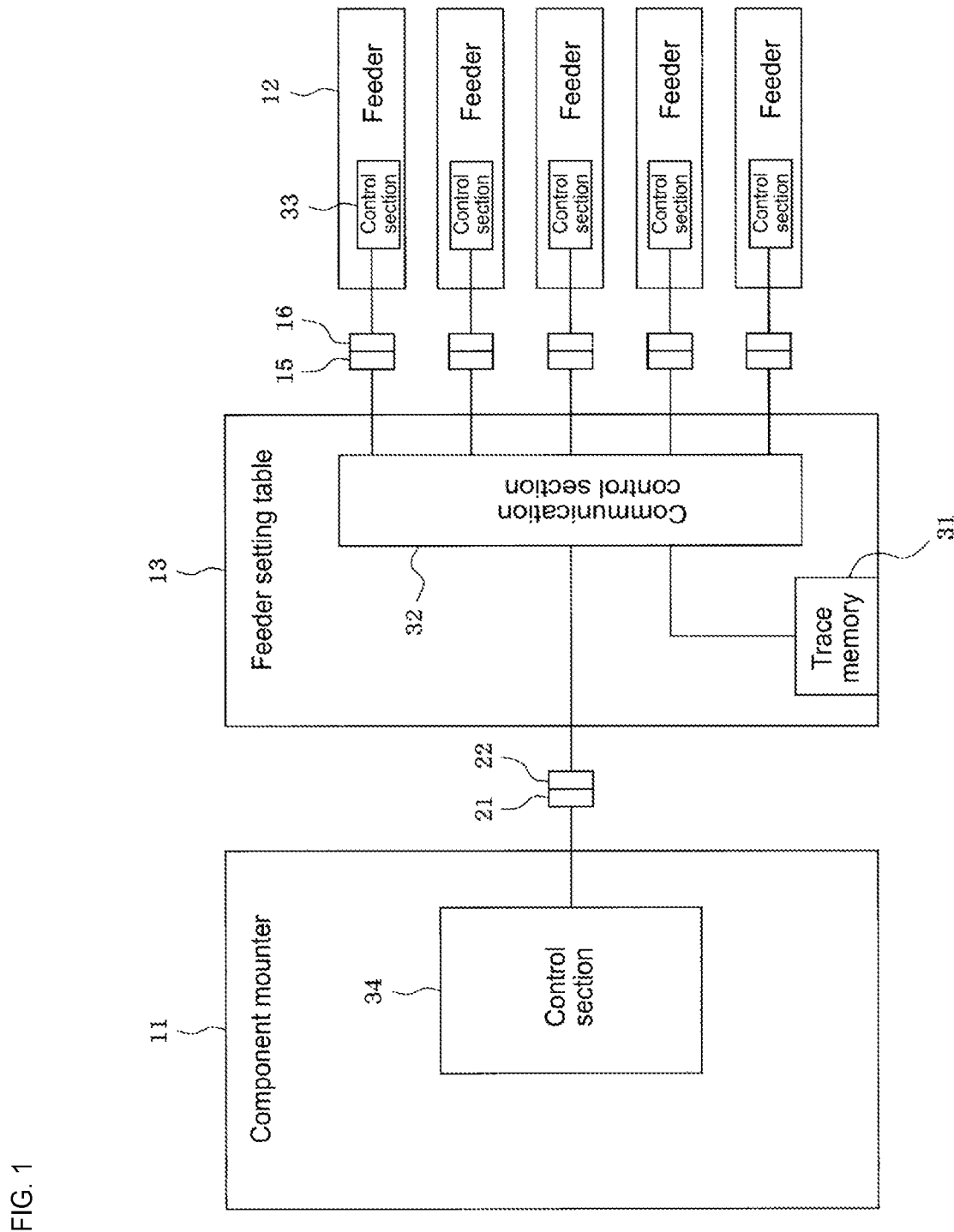
FIG. 1 is a block diagram showing the configuration of a feeder trace log saving system that is an embodiment of the present disclosure.

Note that, connector 22 (refer to FIG. 1) for connecting a signal wire and a power supply wire of feeder setting table 13 to connector 21 (refer to FIG. 1) of component mounter 11 is also provided on a leading end surface of feeder setting table 13, and by attaching feeder setting table 13 to a specified position on component mounter 11, connector 22 of feeder setting table 13 is inserted into and connected to connector 21 of component mounter 11. As shown in FIG. 2, display device 23 that displays various types of information, operation panel 24, and the like, are provided on a top front surface of component mounter 11.

Trace memory 31 (refer to FIG. 1) for saving trace logs of the multiple feeders 12 set on feeder setting table 13 is provided on feeder setting table 13. Here, trace memory 31 is a rewritable non-volatile storage medium, and in the present embodiment is or includes a removable non-volatile storage medium (for example, USB memory, memory card, electromagnetic disk, magneto-optical disk, or the like).

Communication control section 32 that controls communication between component mounter 11 and multiple feeders 12 is provided in feeder setting table 13, and trace logs of each of the feeders 12 output to feeder setting table 13 from control section 33 of the multiple feeders 12 on feeder setting table 13 while component mounter 11 is operating are saved in trace memory 31 by communication control section 32 of feeder setting table 13 linked to identification information (feeder ID) of each of the feeders 12. Each time a new trace log is output from each of the feeders on feeder setting table 13 while component mounter 11 is operating, that trace log is written to trace memory 31 in chronological order, and trace logs for a specified period up to that point are saved in chronological order, with trace logs older than the specified period being deleted.

Further, with the present embodiment, control section 34 of component mounter 11 is able to output component mounter 11 trace log to feeder setting table 13, and communication control section 32 in feeder setting table 13 is able to save the component mounter 11 trace log output from the component mounter 11 in trace memory 31. Note that, an operator can operate operation panel 24 to select whether to save component mounter 11 trace logs in trace memory 31.

According to an embodiment described above, because a feeder 12 trace log is output from each of the multiple feeders 12 on feeder setting table 13 while component mounter 11 is operating and saved in trace memory 31 linked to the identification information of each of the feeders 12, it is possible to save trace logs from multiple feeders 12 on feeder setting table 13 all together in shared trace memory 31, such that it is not necessary to load trace memory on each feeder 12, thereby meeting requirements of compact feeders 12 and lower costs. Further, because it is not necessary for control section 34 of component mounter 11 to perform processing of saving multiple feeder 12 trace logs while component mounter 11 is operating, decreases in processing speed caused by large CPU loads on control section 34 of component mounter 11 due to processing of saving trace logs of multiple feeders 12 can be prevented, and it is possible to save trace logs of multiple feeders 12 in trace memory 31 without worsening productivity (cycle time). In this case, because trace logs of multiple feeders 12 are saved in trace memory 31 linked to the identification information of each of the feeders 12, when some kind of problem occurs with a feeder 12, the trace log saved linked to the identification information of the feeder 12 for which the trouble occurred can be read from trace memory 31, such that the cause of the problem with the feeder 12 can be investigated easily.

Further, with the present embodiment, because the trace logs of each of the feeders 12 output to feeder setting table 13 from the multiple feeders 12 are saved by communication control section 32 of feeder setting table 13 linked to identification information of each of the feeders 12, unlike a configuration in which trace memory 31 is provided in a different location to feeder setting table 13, it is possible to save the trace logs output from multiple feeders 12 using communication control section 32 of feeder setting table 13, which has the benefit of a simplified circuit configuration for saving the trace logs of multiple feeders 12 in trace memory 31. However, with the present disclosure, trace memory 31 may be provided at a different location to feeder setting table 13.

Also, with the present embodiment because trace memory 31 is or includes a removable storage medium, as well as allowing trace memory 31 to be exchanged simply, when a problem occurs with a feeder 31, trace memory 31 can be removed from feeder setting table 13 and sent to a department that investigates causes of problems (such as a company that manufactures or sells the feeder 12), such that even in a case in which component mounter 11 is not connected to a computer of the department that investigates causes of problems, the trace logs can be easily read from trace memory 31 at the department that investigates causes of problems in order to investigate the cause of the problem.

Note that, in a case in which component mounter 11 is connected via a network to a computer of the department that investigates causes of problems, a trace log sending request is sent to communication control section 32 of feeder setting table 13 from control section 34 of component mounter 11, and trace logs are read from trace memory 31 according to trace log sending requests and sent to control section 34 of component mounter 11, and control section 34 of component mounter 11 sends the received trace logs to the computer of the department that investigates causes of problems via the network.

Also, feeders 12 for which a trace log is to be saved are not limited to tape feeders set on feeder setting table 13, for example, they may be bulk feeders, stick feeders, tray feeders, die supply devices, or the like; that is, so long as the feeder is set on component mounter 11, regardless of the type, the present disclosure can be applied, and trace logs of two or greater different types of feeders set on component mounter 11 may be saved all together in the trace memory.

In addition, it goes without saying that various embodiments with changes that do not extend beyond the scope of the disclosure are possible such as those with changes to the circuit configuration that saves trace logs of multiple feeders 12 in trace memory 31.

REFERENCE SIGNS LIST

11: component mounter; 12: feeder; 13: feeder setting table; 31: trace memory; 32: communication control section; 33: feeder control section; 34: component mounter control section

The invention claimed is:

1. A feeder trace log saving system for saving trace logs of multiple feeders that supply components to a component mounter, the feeder trace log saving system comprising:
   a shared trace memory configured to save the trace logs of the multiple feeders when the multiple feeders are simultaneously electrically connected to the shared trace memory, wherein
   a control section of each of the multiple feeders is configured to output a trace log of a respective feeder to the shared memory while the component mounter is operating and the multiple feeders are simultaneously electrically connected to the shared trace memory,
   the trace logs are saved in the shared trace memory linked to identification information of each of the multiple feeders, and
   the shared trace memory is external to the multiple feeders,
   the component mounter is provided with a feeder setting table on which the multiple feeders are removably and simultaneously set, and
   the shared trace memory is disposed inside the feeder setting table on which the multiple feeders are removably and simultaneously set and is simultaneously electrically connected to each of the multiple feeders when each of the multiple feeders are simultaneously set in the feeder setting table.

2. The feeder trace log saving system according to claim 1, wherein
   a communication control section, which is distinct from the control section of each of the multiple feeders, configured to control communication between the component mounter and the multiple feeders is provided in the feeder setting table on which the multiple feeders are removably and simultaneously set, and
   the communication control section in the feeder setting table on which the multiple feeders are removably and simultaneously set is configured to save the feeder trace log output from each of the multiple feeders in the shared trace memory disposed inside the feeder setting table on which the multiple feeders are removably and simultaneously set linked to the identification information of each of the multiple feeders.

3. The feeder trace log saving system according to claim 2, wherein
   a component mounter control section, which is distinct from the communication control section and the control section of each of the multiple feeders, is configured to output a component mounter trace log to the feeder setting table on which the multiple feeders are removably and simultaneously set, and
   the communication control section in the feeder setting table on which the multiple feeders are removably and simultaneously set is configured to save the component mounter trace log output from the component mounter control section in the shared trace memory disposed inside the feeder setting table on which the multiple feeders are removably and simultaneously set.

4. The feeder trace log saving system according to claim 1, wherein the shared trace memory is a removable storage medium.

5. The feeder trace log saving system according to claim 1, wherein the trace logs are saved in the shared trace memory in chronological order.

6. The feeder trace log saving system according to claim 1, further comprising a component mounter control section, which is distinct from the control section of each of the multiple feeders, the component mounter control section being separated from the shared trace memory via at least one connection interface.

7. The feeder trace log saving system according to claim 1, further comprising:
   a component mounter control section, which is distinct from the control section of each of the multiple feeders; and
   a communication control section provided in the feeder setting table on which the multiple feeders are removably and simultaneously set, which is distinct from the component mounter control section and the control section of each of the multiple feeders, wherein
   the feeder setting table on which the multiple feeders are removably and simultaneously set is a separate component from the component mounter and is electrically connected to the component mounter via at least one first connection interface, and
   the multiple feeders are simultaneously electrically connected to the feeder setting table on which the multiple feeders are removably and simultaneously set via respective multiple second connection interfaces.

8. The feeder trace log saving system according to claim 1, further comprising a component mounter control section, the component mounter control section being configured to read from the shared trace memory disposed inside the feeder setting table on which the multiple feeders are removably and simultaneously set.

9. The feeder trace log saving system according to claim 1, further comprising a component mounter control section, wherein the trace logs output from the respective control sections of the multiple feeders are saved in the shared trace memory without passing through the component mounter control section.

10. The feeder trace log saving system according to claim 1, wherein the shared trace memory is removable from the feeder setting table on which the multiple feeders are removably and simultaneously set.

11. A system, comprising:
a feeder setting table including a plurality of feeder guides, the feeder setting table being detachably connected to a component mounter;
multiple feeders set in the feeder setting table using the plurality of feeder guides, the multiple feeders being detachable from the feeder setting table, wherein
each of the multiple feeders includes a control section configured to output a trace log of the feeder while the component mounter is operating, and
the feeder setting table includes a shared trace memory that is disposed inside the feeder setting table that includes the plurality of feeder guides and is configured to save the trace logs of the multiple feeders set in the feeder setting table when the multiple feeders are simultaneously electrically connected to the shared trace memory.

12. The system according to claim 11, wherein
the feeder setting table that includes the plurality of feeder guides further comprises a communication control section electrically connected to a component mounter control section of the component mounter via at least one first connection interface, and
the multiple feeders set in the feeder setting table using the plurality of feeder guides are electrically connected to the feeder setting table via respective multiple second communication interfaces.

13. The system according to claim 11, wherein the shared trace memory is removable from the feeder setting table that includes the plurality of feeder guides.

14. The system according to claim 11, further comprising the component mounter, wherein
the feeder setting table that includes the plurality of feeder guides further comprises a communication control section electrically connected to the component mounter,
the communication control section is configured to control communication between the component mounter and the multiple feeders set in the feeder setting table using the plurality of feeder guides, and
the communication control section is configured to save the feeder trace log output from each of the multiple feeders set in the feeder setting table using the plurality of feeder guides in the shared trace memory that is disposed inside the feeder setting table that includes the plurality of feeder guides and is configured to save the trace logs of the multiple feeders set in the feeder setting table when the multiple feeders are simultaneously electrically connected to the shared trace memory.

15. The system according to claim 14, wherein
the component mounter includes a component mounter control section configured to output a component mounter trace log to the feeder setting table that includes the plurality of feeder guides, and
the communication control section is configured to save the component mounter trace log in the shared trace memory that is disposed inside the feeder setting table that includes the plurality of feeder guides and is configured to save the trace logs of the multiple feeders set in the feeder setting table when the multiple feeders are simultaneously electrically connected to the shared trace memory.

16. The system according to claim 11, wherein the shared trace memory that is disposed inside the feeder setting table that includes the plurality of feeder guides and is configured to save the trace logs of the multiple feeders set in the feeder setting table when the multiple feeders are simultaneously electrically connected to the shared trace memory is external to the multiple feeders set in the feeder setting table that includes the plurality of feeder guides.

17. A system, comprising:
a feeder setting table;
a plurality of feeder guides disposed on the feeder setting table;
a first connector connectable to a component mounter;
a plurality of second connectors disposed above the plurality of feeder guides, each connectable to one of multiple feeders; and
a shared trace memory electrically connected to the first connector and the plurality of second connectors, the shared trace memory being disposed below the plurality of feeder guides and configured to save trace logs received from the multiple feeders when the multiple feeders are connected to the plurality of second connectors, the component mounter is connected to the first connector, and the component mounter is in operation, wherein
the shared trace memory is disposed inside the feeder setting table on which the multiple feeders are removably and simultaneously set and is simultaneously electrically connected to each of the multiple feeders when each of the multiple feeders are simultaneously set in the feeder setting table.

18. The system according to claim 17, wherein the shared trace memory is external to the multiple feeders.

19. The system according to claim 17, wherein the shared trace memory is removable.

20. The system according to claim 12, wherein
the shared trace memory is disposed below the plurality of feeder guides, and
the multiple second communication interfaces are disposed above the plurality of feeder guides.

* * * * *